(12) United States Patent
Liu

(10) Patent No.: US 7,315,085 B2
(45) Date of Patent: Jan. 1, 2008

(54) BALL GRID ARRAY PACKAGE AND METHOD THEREOF

(75) Inventor: Sheng Tsung Liu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 152 days.

(21) Appl. No.: 10/974,936

(22) Filed: Oct. 28, 2004

(65) Prior Publication Data

US 2005/0087867 A1    Apr. 28, 2005

(30) Foreign Application Priority Data

Oct. 28, 2003    (TW) ............................. 92129954 A

(51) Int. Cl.
*H01L 23/48* (2006.01)
*H01L 23/52* (2006.01)
*H01L 29/40* (2006.01)

(52) U.S. Cl. ...................... 257/773; 257/786; 257/779; 257/780; 257/E23.02

(58) Field of Classification Search ................ 257/773, 257/786, 701, 780, 779
See application file for complete search history.

(56) References Cited

U.S. PATENT DOCUMENTS

| 5,636,104 | A | 6/1997 | Oh | |
|---|---|---|---|---|
| 5,969,426 | A * | 10/1999 | Baba et al. | 257/778 |
| 7,071,569 | B2 * | 7/2006 | Ho et al. | 257/778 |
| 2002/0111054 | A1 * | 8/2002 | Huang et al. | 439/83 |
| 2004/0041393 | A1 * | 3/2004 | Lee | 283/100 |
| 2004/0141298 | A1 * | 7/2004 | Harvey | 361/764 |

* cited by examiner

*Primary Examiner*—Nitin Parekh
(74) *Attorney, Agent, or Firm*—Reed Smith LLP; Stanley P. Fisher, Esq.; Juan Carlos A. Marquez, Esq.

(57) ABSTRACT

A ball grid array package includes a substrate, a chip, a plurality of pads, a solder mask, a plurality of partitioning walls, and a plurality of solder balls. The substrate has an upper surface and a lower surface opposite to the upper surface. The chip is disposed on the upper surface of the substrate. The pads are disposed on the lower surface of the substrate and electrically connected to the chip. The solder mask is disposed on the lower surface of the substrate. The partitioning walls are disposed on the solder mask and between the adjacent pads. The solder balls are respectively disposed on the pads.

19 Claims, 3 Drawing Sheets

BALL GRID ARRAY PACKAGE AND METHOD THEREOF

This application claims the priority benefit of Taiwan Patent Application Serial Number 092129954, filed Oct. 28, 2003, the full disclosure of which is incorporated herein by reference.

BACKGROUND OF THE INVENTION

1. Field of the Invention

This invention generally relates to a ball grid array package, and more particularly to a ball grid array package having a plurality of partitioning walls for keeping solder balls in proper position.

2. Description of the Related Art

Miniaturization of semiconductor device size has been an important topic in the art, when the device requires more I/O pins along with the increase of device density. Relatively, the ball grid array (BGA) package is an efficient packaging technology since it can provide more I/O pins.

Referring to FIG. 1, it shows a conventional ball grid array (BGA) package 10 using wire bonding technique and being disposed on a main board 30. The BGA package 10 includes a substrate 20, a chip 11, and a plurality of solder balls 40. The substrate 20 has an upper surface 22, a lower surface 24 opposite to the upper surface 22, and a plurality of metal wirings (not shown). The chip 11 is disposed on the upper surface 22 of the substrate 20 and electrically connected to the metal wirings of the substrate 20 by a plurality of bonding wires 12. The solder balls 40 are disposed on the lower surface 24 of the substrate 20 and electrically connected to the chip 11 through the metal wrings and the bonding wires 12.

Referring to FIGS. 2 and 3, in manufacturing processes of the BGA package 10, a solder mask 26 is provided on the lower surface 24 of the substrate 20 and a plurality of pads 50 are exposed therefrom. A plurality of flux units 60 are applied to the pads 50. Then, the solder balls 40 are disposed on the flux units 60 and adhered to the pads 50 (as shown in FIG. 3) by a reflow process.

After the solder balls 40 pass through the reflow process, a solder bridge formed between two pads 50 as shown in FIG. 3 might be occurred due to the spread of the flux units 60. Further, in manufacturing and/or transporting processes, the solder balls 40 may also be shifted due to the occurrence of a shake, a vibration and so on such that the implantation yield of the solder balls 40 is reduced.

For example, U.S. Pat. No. 5,636,104 discloses a BGA package using wire bonding technique, which is incorporated herein by reference. The substrate of such a BGA package comprises a plurality of groove mounting pads for carrying a plurality of solder balls, thereby improving the strength and the positioning capability of the solder balls on the substrate. However, the plurality of groove mounting pads will increase the manufacturing processes and cost.

Accordingly, there exists a need to provide a BGA package which can improve the positioning capability and increase the implantation yield of the solder balls.

SUMMARY OF THE INVENTION

It is an object of the present invention to provide a ball grid array (BGA) package, which can avoid the shift problem of the solder balls and thus improve the positioning accuracy of the solder balls on the substrate.

In order to achieve the above object, the present invention provides a BGA package including a substrate, a chip, a plurality of pads, a solder mask, a plurality of partitioning walls, and a plurality of solder balls. The substrate has an upper surface and a lower surface opposite to the upper surface. The chip is disposed on the upper surface of the substrate. The pads are disposed on the lower surface of the substrate and electrically connected to the chip. The solder mask is disposed on the lower surface of the substrate. The partitioning walls are disposed on the solder mask and each between the adjacent pads. The solder balls are respectively disposed on the pads.

According to the BGA package of the present invention, the plurality of partitioning walls can prevent the flux from spreading and therefore avoid the solder bridge being formed between two solder balls. Furthermore, the plurality of partitioning walls can also prevent the solder balls from being shifted and therefore increase the implantation yield of the solder balls.

BRIEF DESCRIPTION OF THE DRAWINGS

Other objects, advantages, and novel features of the present invention will become more apparent from the following detailed description when taken in conjunction with the accompanying drawings.

DETAILED DESCRIPTION OF THE PREFERRED EMBODIMENT

Figure 1:
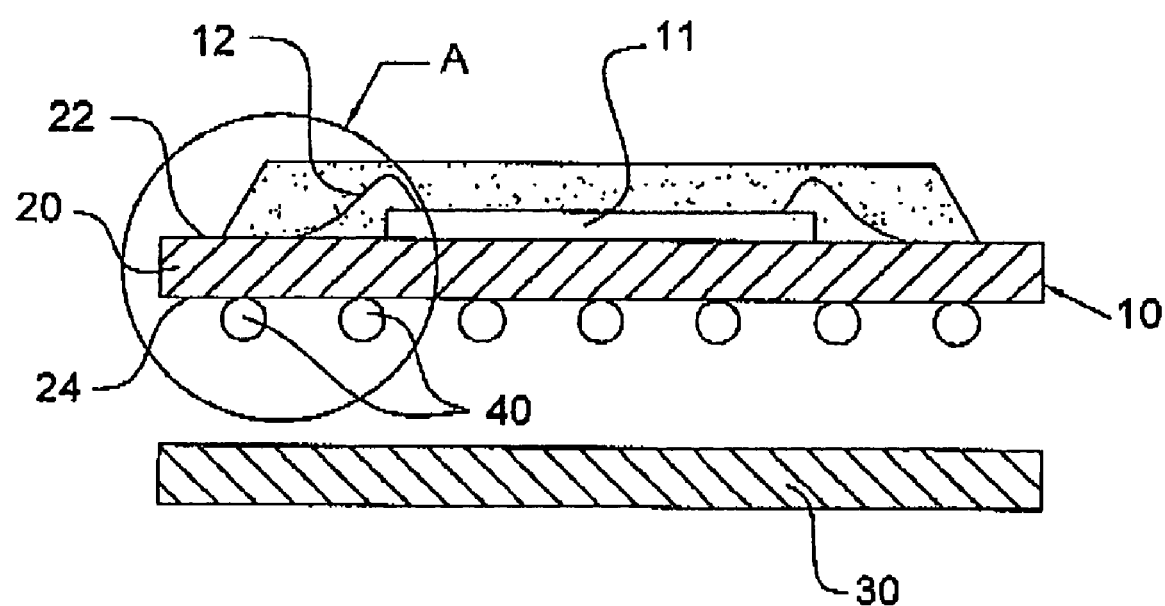
FIG. 1 is a cross-sectional view of a conventional BGA package using wire bonding technique and being disposed on a main substrate.
Figure 2:
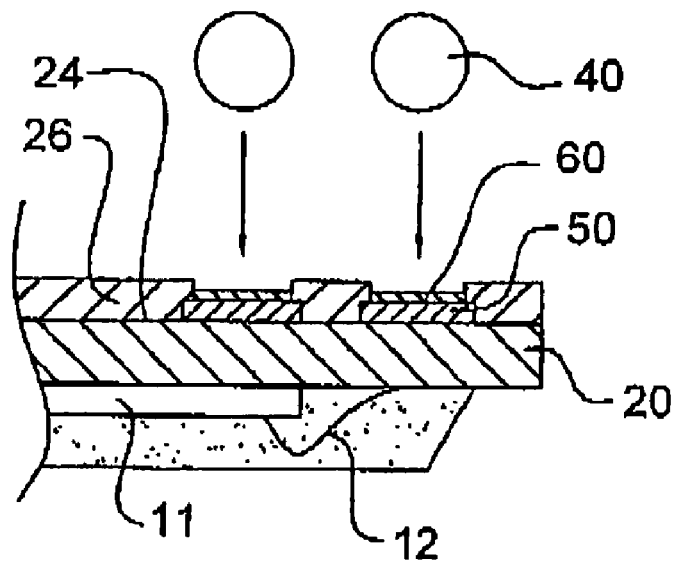
FIG. 2 is an enlarged view of the area A shown in FIG. 1.
Figure 3:
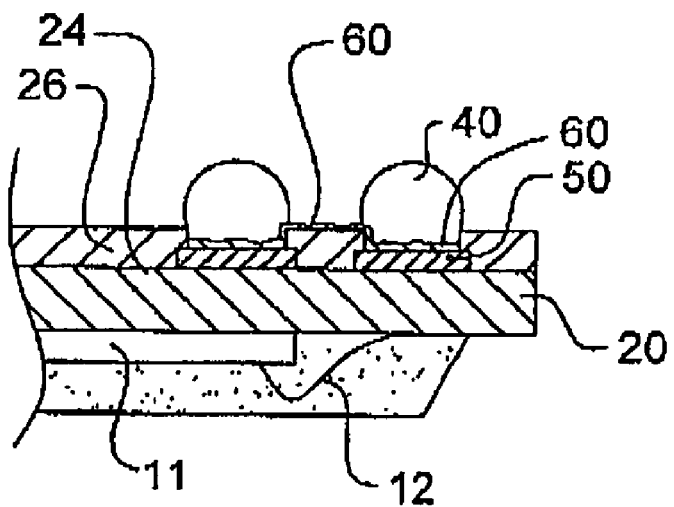
FIG. 3 illustrates that the solder balls of FIG. 2 are adhered to the pads trough a reflow process.
Figure 4:
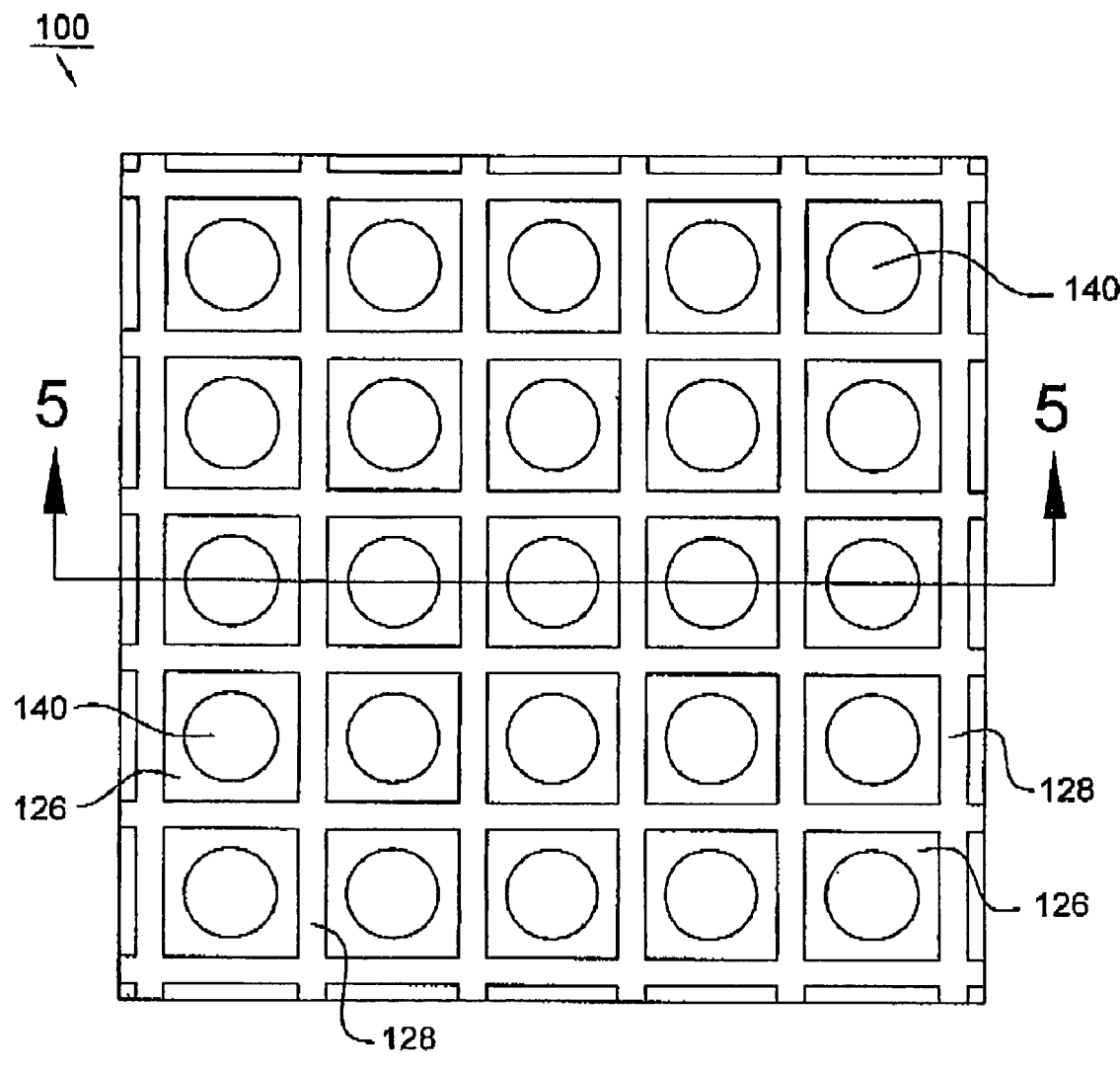
FIG. 4 is a bottom view of a BGA package according to one embodiment of the present invention.
Figure 5:
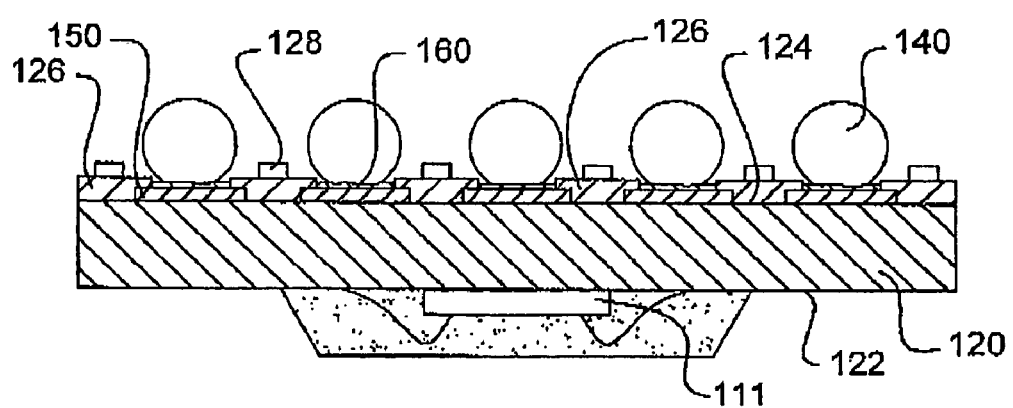
FIG. 5 is a cross-sectional view of the BGA package taken along line 5-5 of FIG. 4.

FIGS. 4 and 5 show a ball grid array (BGA) package 100 according to one embodiment of the present invention. The BGA package 100 includes a substrate 120 and a chip 111. The substrate 120 has an upper surface 122, a lower surface 124 opposite to the upper surface, and a plurality of wirings (not shown). The chip 111 is disposed on the upper surface 122 of the substrate 120 and electrically connected to the wirings of the substrate through bonding wires, that is, the chip 111 is electrically connected to the substrate by wire bonding technique. A package body is formed over the chip 111 and a portion of the upper surface 122 of the substrate 120. It should be understood by a skilled person in art that the chip 111 can be replaced by a flip chip.

A plurality of pads 150 are disposed on the lower surface 124 of the substrate 120 and electrically connected to the chip 111 through the wirings. A plurality of solder balls 140 are respectively disposed on the plurality of pads 150. A solder mask 126 is applied over the lower surface 124 of the substrate 120 while the plurality of pads 150 are exposed therefrom. The substrate 120 further has a plurality of partitioning walls 128, which are disposed on and extend from the solder mask 126, for partitioning the plurality of pads 150 and accurately positioning the solder balls 140 in place.

The plurality of partitioning walls 128 can be made in many different patterns. For example, the plurality of partitioning walls 128 can be made in a continuous pattern, e.g.

a lattice pattern as shown in FIG. 4. Alternatively, the plurality of partitioning walls 128 can be made in a plurality of discontinuous or independent patterns, such as a plurality of ring-shaped, C-shaped or line-shaped patterns (not shown), for respectively partitioning the adjacent pads 150.

It should be understood by a skilled person in art that a plurality of preflux or flux units 160, such as solder paste, can be respectively disposed on the plurality of pads 150 for facilitating the adherence of the solder balls 140 to the substrate 120.

The height of the partitioning wall 128 of the BGA package 100 is determined by the heights of the pad 150, the flux unit 160 and the solder ball 140. The width of the partitioning wall 128 is determined by the dispositions of the pad 150, the flux unit 160 and the solder ball 140. In one specific embodiment of the present invention, each partitioning wall 128 is substantially about 0.025 mm to 0.08 mm in height and encloses each pad 150 so as to form a lattice arrangement.

The material of the partitioning wall 128 is generally the same with that of the solder mask 126, such as epoxy resin, such that the partitioning wall 128 is similar to the substrate 120 in chemical and physical characteristics thereby avoiding incompatibility between both of them.

In the manufacturing process of the BGA package 100, a substrate 120 having an upper surface 122 and a lower surface 124 is first provided. Then, a chip 111 is disposed on the upper surface 122 of the substrate 120 and electrically connected to the substrate 120 by wire bonding technique. Then, a package body is molded for encapsulating the chip 111 and a portion of the upper surface 122 of the substrate 120. It should be understood by a skilled person in art that the chip 111 can also be electrically connected to the substrate 120 by flip chip technique. A solder mask 126 is applied to the lower surface 124 of the substrate 120 and a plurality of pads 150 are defined. Then, a plurality of partitioning walls 128 are formed on the solder mask 126 by printed process or photolithography and etching processes and used for respectively partitioning the plurality of pads 150. A plurality of flux units 160 can be further applied to the plurality of pads 150. Next, a plurality of solder balls 140 are respectively disposed on the flux units 160 and finally soldered to the pads 150 through a reflow process so as to form the BGA package 100.

Accordingly, the BGA package 100 according to the present invention has the plurality of partition walls 128 for preventing the flux units 160 from spreading and therefore further preventing the solder bridge formed between the pads 150. In addition, the plurality of partitioning walls 128 can also prevent the plurality of solder balls 140 from being shifted and therefore increase the implantation yield of the solder balls 140.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A ball grid array (BGA) package comprising:
   a substrate having an upper surface and a lower surface opposite to the upper surface;
   a chip disposed on the upper surface of the substrate;
   a plurality of pads disposed on the lower surface of the substrate and electrically connected to the chip;
   a solder mask disposed on the lower surface of the substrate; and
   a plurality of partitioning walls disposed on the solder mask,
   wherein each partitioning wall is positioned between two adjacent pads and prevents a solder bridge formed between the adjacent pads.

2. The ball grid array package as claimed in claim 1 further comprising a plurality of solder balls respectively disposed on the plurality of pads.

3. The ball grid array package as claimed in claim 2 further comprising a plurality of flux units disposed on the pads for facilitating the adherence of the solder balls to the pads.

4. The ball grid array package as claimed in claim 1, wherein the chip is a wire-bonding chip.

5. The ball grid array package as claimed in claim 4 further comprising a package body encapsulating the chip and a portion of the upper surface of the substrate.

6. The ball grid array package as claimed in claim 1, wherein the chip is a flip chip.

7. The ball grid array package as claimed in claim 6 further comprising a package body encapsulating the chip and a portion of the upper surface of the substrate.

8. The ball grid array package as claimed in claim 1, wherein the partitioning wall is about 0.025 mm to 0.08 mm in height.

9. The ball grid array package as claimed in claim 1, wherein the partitioning walls are made of epoxy resin.

10. The ball grid array package as claimed in claim 1, wherein the material of the partitioning walls is the same with that of the solder mask.

11. The ball grid array package as claimed in claim 1, wherein the plurality of partitioning walls are made in a continuous pattern enclosing the plurality of pads.

12. The ball grid array package as claimed in claim 11, wherein the continuous pattern is a lattice pattern.

13. The ball grid array package as claimed in claim 1, wherein the plurality of partitioning walls are made in a plurality of discontinuous patterns.

14. A substrate comprising:
    an upper surface and a lower surface opposite to the upper surface;
    a plurality of pads disposed on the lower surface;
    a solder mask disposed on the lower surface; and
    a plurality of partitioning walls disposed on the solder mask,
    wherein each partitioning wall is positioned between two adjacent pads and prevents a solder bridge formed between the adjacent pads.

15. The substrate as claimed in claim 14 further comprising a plurality of solder balls respectively disposed on the plurality of pads.

16. The substrate as claimed in claim 15 further comprising a plurality of flux units disposed on the pads for facilitating the adherence of the solder balls to the pads.

17. The substrate as claimed in claim 14, wherein the partitioning wall is about 0.025 mm to 0.08 mm in height.

18. The substrate as claimed in claim 14, wherein the partitioning walls are made of epoxy resin.

19. The substrate as claimed in claim 14, wherein the material of the partitioning walls is the same with that of the solder mask.

* * * * *